United States Patent
Priesemuth

[11] Patent Number: 6,100,464
[45] Date of Patent: Aug. 8, 2000

[54] SOLAR CELL AND METHOD OF PRODUCING SAME

[76] Inventor: Wolfgang Priesemuth, Heberthal 1, D-83512 Wasserburg, Germany

[21] Appl. No.: 08/993,345

[22] Filed: Dec. 18, 1997

[30] Foreign Application Priority Data

Dec. 18, 1996 [DE] Germany .......................... 196 52 818

[51] Int. Cl.$^7$ ................................................ H01L 31/103
[52] U.S. Cl. .......................... 136/256; 136/258; 136/252; 136/261; 257/71; 257/75; 257/53; 257/431; 257/461; 438/470; 438/88; 438/96; 438/97
[58] Field of Search .............................. 136/256, 258 PC, 136/258 AM, 252, 261; 257/51, 75, 53, 431, 461; 438/470, 88, 96, 97

[56] References Cited

U.S. PATENT DOCUMENTS

| 4,390,743 | 6/1983 | Dahlberg | 136/258 |
|---|---|---|---|
| 4,514,580 | 4/1985 | Bartlett | 136/250 |
| 4,602,422 | 7/1986 | Dinh | 438/88 |
| 4,690,797 | 9/1987 | Eyer et al. | 117/10 |

FOREIGN PATENT DOCUMENTS

| 3035563 | 4/1982 | Germany . |
|---|---|---|
| 3536743 | 4/1987 | Germany . |

OTHER PUBLICATIONS

Hu et al., Solar Cells from Basic to Advanced Systems, pp. 39, 48–50, 70, and 81. (month unknown), 1983.

*Primary Examiner*—Alan Diamond
*Attorney, Agent, or Firm*—Robert W. Becker & Associates

[57] ABSTRACT

A method is provided of producing a solar cell having a semiconductor layer within which, in a direction of thickness, a p-n barrier layer is present, and which can be irradiated with light from at least one side. The cell has contacts for electrical contact of the semiconductor layer on respective sides of the p-n barrier layer. The semiconductor layer is produced by reducing the size of semiconductor material to powder, heating the powder, and sintering the heated powder in a sintering press to form the semiconductor layer.

5 Claims, 1 Drawing Sheet

SOLAR CELL AND METHOD OF PRODUCING SAME

BACKGROUND OF THE INVENTION

The present invention relates to a method of producing a solar cell having a semiconductor layer within which, in a direction of thickness, a p-n barrier layer is present, and which can be irradiated with light from at least one side, the cell also having contacts for electrical contact of the semiconductor layer on respective sides of the p-n barrier layer. The present invention also relates to a solar cell having such a semiconductor layer.

Regenerative energy is acquiring increased significance. In this connection, the photovotaic field plays a key role since via photovoltaics it is possible to directly convert sunlight into electrical current that has many uses. However, the presently conventional method of producing solar cells is extremely expensive, as a consequence of which up to now solar power has been only of secondary importance.

Pursuant to one conventional manufacturing process, rod-like semiconductor material, generally mono or poly crystalline silicon, is cut into thin discs or sheets that form the main body of the solar cell that is produced in further processing stages. The cutting of these discs is very expensive from a tooling standpoint, requires great precision, and involves great losses of material. The cut discs, the thicknesses of which are in the range of tenths of a millimeter and less, must be handled very carefully due to their brittleness.

Pursuant to another known method, layers having thicknesses of 10 to 50 $\mu$m of amorphous silicon or some other semiconductive material are deposited on a carrier, from which then the solar cells are produced in further process steps (manufacture of the barrier layer by appropriate doping, contacting, etc.). The effectiveness of such thin layer solar cells is generally less than that of the monocrystaline solar cells, yet uses less semiconductor material per unit of generated energy.

None of the heretofore known methods has led to adequately economical solar cells that aid in the breakthrough of environmentally friendly solar power.

It is therefore an object of the present invention to provide an economical method of producing solar cells, and also to make available an economical solar cell.

BRIEF DESCRIPTION OF THE DRAWINGS

This object, and other objects and advantages of the present invention, will appear more clearly from the following specification in conjunction with the accompanying schematic drawings, in which.

SUMMARY OF THE INVENTION

The method of the present invention of producing a solar cell is characterized primarily by the steps of reducing the size of semiconductor material to powder, heating the powder, and sintering the heated powder in a sintering press to form a coherent simiconductor layer.

With the method of the present invention, it is no longer necessary to cut semiconductor material, accompanied by great losses, from expensive, rod-shaped starting material, or to deposit semiconductor material as amorphous semiconductor layer on a carrier. Rather, semiconductor material having a purity that is suitable for manufacturing solar cells is reduced in size in a simple manner to powder, whereupon the powder is heated and is sintered in a sintering mold to form the semiconductor layer. It was unexpectedly discovered that such sintered semiconductor layers, after the conventional fabrication of a barrier layer by doping as well as possibly the conventional further steps such as contacting, depositioning on a carrier, as well as provision with protective layers, have a satisfactory effectiveness at favorable manufacturing costs.

The semiconductor material that is to be pulverized and then sintered can be any conventional semiconductor material that is suitable for sintering. The semiconductor material is advantageously high purity silicon.

The semiconductor material is preferably already doped prior to the sintering, for example it is n-conductive, so that the sintered semiconductor layer, for producing the barrier layer, need then be doped only with a trivalent material, such as boron.

Pursuant to further advantageous specific embodiments of the inventive method, that surface of the semiconductor layer that is provided for irradiation with light can be formed with a corrugation by forming the sintering mold with an appropriately shaped inner surface. Such a corrugation can be formed by pyramids. In addition, the semiconductor layer can be sintered on a metal plate that is disposed in the sintering mold, with the metal plate then forming a contact for the semiconductor layer. The dimensions of the metal plate can be such that it forms a carrier structure for the semiconductor layer.

The solar cell of the present invention is characterized primarily in that it is built up of a semiconductor layer that is made of sintered semiconductor material. As indicated previously, pursuant to one specific embodiment of the present invention the semiconductor layer of the solar cell can be sintered on a metal plate to which an electrical contact is connected.

Further specific features of the present invention will be described in detail subsequently.

DESCRIPTION OF PREFERRED EMBODIMENTS

Figure 1:
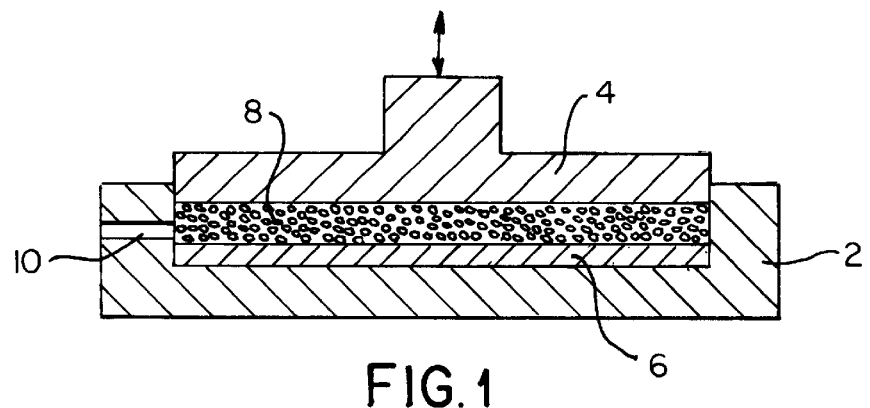
FIG. 1 is a cross-sectional view through one exemplary embodiment of a sintering press for practicing the method of the present invention.

Referring now to the drawings in detail, FIG. 1 shows a sintering press having a base mold 2 and a stamp or press 4. Disposed in the base mold 2 is a metal plate 6, for example of copper, aluminum, silver-plated tempered steel, etc. The metal plate 6 has a thickness of, for example, at most a few millimeters. Disposed over the metal plate 6 is a powder 8 of semiconductor material, for example high purity silicon for solar purposes.

Leading into the sintering space between the press 4 and the base mold 2 is a venting channel 10. The entire sintering space can be heated up to a predetermined temperature by a non-illustrated heating means that is disposed within the base mold 2 or the press 4. To effect the sintering process, the powder 8 that is disposed within the sintering press is heated in a known manner to a temperature considerably below the melting point of the powder and of the metal plate 6; by moving the press 4 downwardly the powder is sintered under high pressure.

A semiconductor or barrier layer of sintered material results; this layer is fixedly connected with the metal plate 6 and forms the main body of a solar cell that is to be fabricated. It is to be understood that various further measures can be undertaken in order to ensure a reliable connection between the sintered semiconductor material and the metal plate 6; for example, the metal plate 6 can be coated with conductive adhesive paste, etc.

The process parameters, such as the sintering pressure and sintering temperature, as well as the thrust of the press 4, are selected in a suitable manner so that on the one hand the metal plate 6 remains intact, and on the other hand a reliable and satisfactory sintering of the powder 8 to a semiconductor layer results having a thickness that is in the range of semiconductor layer thicknesses of conventional solar cells, for example between 10 $\mu$m and 1 mm.

The powder 8 is advantageously doped prior to the sintering so as to be "n" or "p" conductive, so that after removal of the main body from the sintering press, the barrier layer can be formed by a further, reverse doping.

Figure 4:
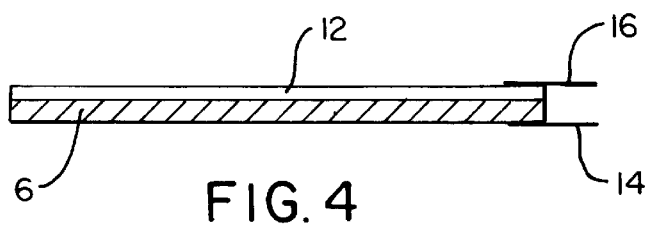
FIG. 4 is a cross-sectional view through one exemplary embodiment of the inventive solar cell.

The metal plate 6 forms not only a large surface electrical contact for the semiconductor layer 12 (FIG. 4), but also a carrier for this semiconductor layer 12 that leads to a stable and easy to handle solar cell. Extending from the metal plate 6 is a contact 14, which is, for example, soldered thereto, and to which can be connected a lead. Disposed on the semiconductor layer 12 in a known manner is a comb-like conductive layer that covers as small a surface area of the semiconductor layer 12 as possible, so that as great a surface as possible is exposed for the irradiation of the blocking layer that is disposed just below the surface. Extending from the comb-like conductive layer is a further contact 16 that can be connected to a further electrical lead.

It is to be understood that diverse embodiments and modifications of the described embodiment are possible. For example, venting channels 10 can be disposed all the way around the sintering space and can be connected to a vacuum pump, so that any air that results during the sintering can be reliably drawn off and will not lead to air bubbles.

In addition, the metal plate 6 can be entirely absent, so that the main body of the solar cell merely comprises the sintered semiconductor lamella or small plate that, similar to conventional cut-out silicon discs, are further processed to complete solar cells.

Figure 2:
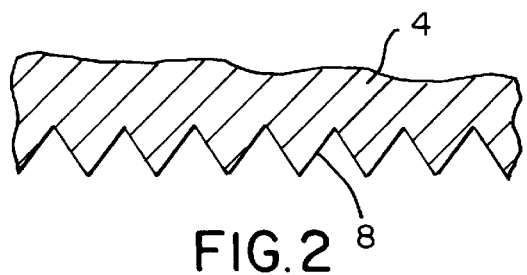
FIG. 2 is an enlarged detailed view of the underside of the press of the centering mold of FIG. 1.
Figure 3:
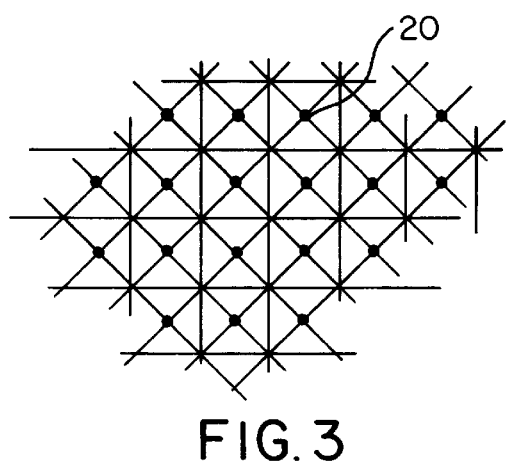
FIG. 3 is an enlarged partial view of the underside of the press of the sintering mold of FIG. 1.

For the effectiveness of the solar cell it is advantageous to increase the surface of that side of the semiconductor layer 12 (FIG. 4) that is to be irradiated with light; this is done, for example, by providing the underside of the press 4 with a corrugation, an embossing, a pattern, or the like as illustrated in FIG. 2. The corrugation 18 in the illustrated detailed view of the underside of the press 4 has a saw tooth shape, with such saw tooth shape in the illustrated embodiment resulting from the profile of individual pyramids 20 that are formed in the underside of the press 4. In FIG. 3, the peaks or vertices of the pyramids 20 are indicated by points in the illustrated portion of the underside of the press 4. The corrugation of the underside of the press 4 is during sintering reproduced in the upper surface of the semiconductor layer 12 (FIG. 4), so that this semiconductor layer comprises individual pyramids that favorably influence the quantity of light that is absorbed. It is to be understood that additional antireflection layers, protective layers, etc. can be applied.

The underside of the press 4 is advantageously embodied in such a way that the corrugation is provided only where later no comb-like conductive layer is to be formed for contacting the exposed surface of the semiconductor layer 12.

The specification incorporates by reference the disclosure of German priority document of 196 52 818.6.

The present invention is, of course, in no way restricted to the specific disclosure of the specification and drawings, but also encompasses any modifications within the scope of the appended claims.

What I claim is:

1. The method of producing a solar cell, including the steps of:

introducing a metal plate into a sintering press;

providing an n- or p-doped semiconductor material;

reducing the size of said material to powder;

introducing said powder onto said metal plate in said sintering press;

heating said powder to a temperature below the melting temperature thereof and sintering said powder in said sintering press to form a coherent semiconductor layer on said metal plate, which provides a carrier structure for said semiconductor layer;

doping said semiconductor layer from the side thereof remote from said metal plate to form a p-n barrier layer in the direction of thickness of said semiconductor layer;

providing a first electrical contact means on said metal plate; and providing a second electrical contact on a portion of the side of said semiconductor layer that is to be irradiated with light.

2. The method according to claim 1, which includes the step of using high purity silicon as said semiconductor material.

3. The method according to claim 1, which includes the step of forming said sintering press with an appropriately shaped inner surface in order to form a corrugation on the surface of said semiconductor layer that is provided for irradiation with light.

4. The method according to claim 3, wherein said corrugation is formed by pyramids.

5. A solar cell comprising:

a metal plate forming a carrier structure;

a coherent semiconductor layer of semiconductor material that is sintered on said metal plate at a temperature below the melting temperature of the layer material and has a p-n barrier layer in the direction of thickness of said semiconductor layer;

a first electrical contact provided on said metal plate; and a second electrical contact provided on a portion of the side of said semiconductor layer that is to be irradiated with light.

* * * * *